US008457161B2

(12) United States Patent
Yu et al.

(10) Patent No.: US 8,457,161 B2
(45) Date of Patent: Jun. 4, 2013

(54) DIGITAL BROADCASTING SYSTEM AND METHOD

(75) Inventors: Jung-pil Yu, Suwon-si (KR); Hae-joo Jeong, Seoul (KR); Eui-jun Park, Seoul (KR); Joon-soo Kim, Seoul (KR); Yong-sik Kwon, Seoul (KR); Jin-hee Jeong, Anyang-si (KR); Yong-deok Chang, Suwon-si (KR); Kum-ran Ji, Seoul (KR); Jong-hun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/713,767

(22) Filed: Feb. 26, 2010

(65) Prior Publication Data

US 2010/0150251 A1   Jun. 17, 2010

Related U.S. Application Data

(62) Division of application No. 11/504,024, filed on Aug. 15, 2006.

(60) Provisional application No. 60/728,777, filed on Oct. 21, 2005, provisional application No. 60/734,295, filed on Nov. 8, 2005, provisional application No. 60/738,050, filed on Nov. 21, 2005, provisional application No. 60/739,448, filed on Nov. 25, 2005, provisional application No. 60/788,707, filed on Apr. 4, 2006.

(30) Foreign Application Priority Data

Jul. 20, 2006   (KR) .................. 10-2006-0068071

(51) Int. Cl.
*H04H 20/28*   (2008.01)

(52) U.S. Cl.
USPC .......................................................... 370/487

(58) Field of Classification Search
USPC .................................................. 370/487, 476
See application file for complete search history.

(56) References Cited

U.S. PATENT DOCUMENTS 5,321,725 A   6/1994  Paik et al.
6,889,351 B1  5/2005  Meehan
(Continued)

FOREIGN PATENT DOCUMENTS

CA   2677963 A1   11/2005
CA   2677967 A1   11/2005
(Continued)

OTHER PUBLICATIONS

International Search Report mailed on Feb. 1, 2007, in International Application No. PCT/KR2006/004320.

(Continued)

*Primary Examiner* — Mark Rinehart
*Assistant Examiner* — Mohammad Anwar
(74) *Attorney, Agent, or Firm* — Sughrue Mion, PLLC

(57) ABSTRACT

A digital broadcasting system and method, where the digital broadcasting system includes: a transmission stream generator multiplexing a normal stream and a turbo stream to generate a dual transmission stream; a transmitter inserting an supplementary reference signal (SRS) into the dual transmission stream, processing the turbo stream to reconstitute the dual transmission stream, and outputting the reconstituted dual transmission stream; and a receiver receiving the reconstituted dual transmission stream, separately turbo decoding the turbo stream, inserting the turbo decode turbo stream into the dual transmission stream, and decoding the dual transmission stream into which the turbo decoded turbo stream has been inserted, to restore normal stream data and turbo stream data. Thus, reception sensitivity of a digital broadcasting signal can be efficiently improved.

14 Claims, 16 Drawing Sheets

U.S. PATENT DOCUMENTS

| | | | |
|---|---|---|---|
| 7,092,455 B2 * | 8/2006 | Choi et al. | 375/301 |
| 7,274,744 B2 * | 9/2007 | Lozhkin | 375/260 |
| 7,418,034 B2 * | 8/2008 | Xia et al. | 375/233 |
| 2001/0033611 A1 | 10/2001 | Grimwood et al. | |
| 2001/0055342 A1 | 12/2001 | Fimoff | |
| 2002/0091973 A1 | 7/2002 | Choi et al. | |
| 2002/0172277 A1 | 11/2002 | Choi et al. | |
| 2002/0186780 A1 | 12/2002 | Choi et al. | |
| 2002/0194570 A1 | 12/2002 | Birru et al. | |
| 2003/0079173 A1 | 4/2003 | Birru | |
| 2003/0101407 A1 * | 5/2003 | Ariel et al. | 714/774 |
| 2004/0057535 A1 * | 3/2004 | Strolle et al. | 375/340 |
| 2005/0111586 A1 | 5/2005 | Kang et al. | |

FOREIGN PATENT DOCUMENTS

| | | | |
|---|---|---|---|
| CA | 2679049 A1 | 12/2005 | |
| CA | 2560381 A1 | 4/2007 | |
| JP | 10-322228 A | 12/1998 | |
| JP | 2003-529298 A | 9/2003 | |
| JP | 2004-533797 A | 11/2004 | |
| JP | 2007-519359 A | 7/2007 | |
| KR | 10-2005-0107287 A | 11/2005 | |
| KR | 10-2005-0109052 A | 11/2005 | |
| WO | 02/03678 A2 | 1/2002 | |
| WO | 02/100026 A1 | 12/2002 | |
| WO | 03/003747 A1 | 1/2003 | |
| WO | 2004/043073 A1 | 5/2004 | |
| WO | 2005/071958 A1 | 8/2005 | |

OTHER PUBLICATIONS

Written Opinion of the International Searching Authority mailed on Feb. 1, 2007, in International Application No. PCT/KR2006/004320.
U.S. Appl. No. 11/416,254, filed May 3, 2006, Jung-pil Yu et al., Samsung Electronics Co., Ltd.
U.S. Appl. No. 11/416,258, filed May 3, 2006, Yong-sik Kwon et al., Samsung Electronics Co., Ltd.
U.S. Appl. No. 11/416,457, filed May 3, 2006, Jung-pil Yu et al., Samsung Electronics Co., Ltd.
U.S. Appl. No. 11/503,970, filed Aug. 15, 2006, Jung-pil Yu et al., Samsung Electronics Co., Ltd.
U.S. Appl. No. 11/504,027, filed Aug. 15, 2006, Jung-pil Yu et al., Samsung Electronics Co., Ltd.
U.S. Appl. No. 11/504,029, filed Aug. 15, 2006, Jung-pil Yu et al., Samsung Electronics Co., Ltd.
U.S. Appl. No. 11/504,030, filed Aug. 15, 2006, Jung-pil Yu et al., Samsung Electronics Co., Ltd.
U.S. Appl. No. 11/504,031, filed Aug. 15, 2006, Jung-pil Yu et al., Samsung Electronics Co., Ltd.
U.S. Appl. No. 11/504,038, filed Aug. 15, 2006, Jung-pil Yu et al., Samsung Electronics Co., Ltd.
U.S. Appl. No. 11/504,651, filed Aug. 16, 2006, Jung-pil Yu et al., Samsung Electronics Co., Ltd.
U.S. Appl. No. 11/504,724, filed Aug. 16, 2006, Jung-pil Yu et al., Samsung Electronics Co., Ltd.
U.S. Appl. No. 11/504,725, filed Aug. 16, 2006, Jung-pil Yu et al., Samsung Electronics Co., Ltd.
U.S. Appl. No. 11/504,726, filed Aug. 16, 2006, Jung-pil Yu et al., Samsung Electronics Co., Ltd.
U.S. Appl. No. 11/505,369, filed Aug. 17, 2006, Jung-pil Yu et al., Samsung Electronics Co., Ltd.
U.S. Appl. No. 11/505,894, filed Aug. 18, 2006, Eui-jun Park et al., Samsung Electronics Co., Ltd.
U.S. Appl. No. 11/508,144, filed Aug. 23, 2006, Jung-pil Yu et al., Samsung Electronics Co., Ltd.
U.S. Appl. No. 11/523,716, filed Sep. 20, 2006, Jung-pil Yu et al., Samsung Electronics Co., Ltd.
U.S. Appl. No. 11/692,509, filed Mar. 28, 2007, Hae-joo Jeong et al., Samsung Electronics Co., Ltd.
Office Action issued Sep. 21, 2010, in counterpart Mexican Application No. MX/a/2008/005202.
Canadian Office Action issued in Application No. 2686676, dated Jan. 26, 2011.
Communication dated May 10, 2012 issued by the Canadian Intellectual Property Office in counterpart Canadian Patent Application No. 2,625,160.
Advanced Television Systems Committee, "ATSC Standard: Digital Television Standard (A/53), Revision D, Including Amendment No. 1", Jul. 27, 2005, pp. 1-29 and 59-95.
Communication dated Jan. 31, 2012, issued by the Japanese Patent Office in counterpart Japanese Application No. 2008-536518.
Communication dated Jan. 31, 2012, issued by the Japanese Patent Office in counterpart Japanese Application No. 2009-272142.
Communication dated Jan. 31, 2012, issued by the Japanese Patent Office in counterpart Japanese Application No. 2009-272143.
Communication dated Mar. 20, 2012, issued by the Korean Intellectual Property Office in Korean Application No. 10-2008-0036860.
Park, Eui Jun et al., "Supplementary Reference Sequence VSB System", Consumer Electronics, ICCE, Jan. 10, 2007, pp. 1-2.

* cited by examiner

| SYNC | PID | AF Header | SRS | Turbo Data |
|------|-----|-----------|-----|------------|
| SYNC | PID | AF Header | SRS | Normal Data |
| SYNC | PID | AF Header | SRS | Normal Data |
| SYNC | PID | AF Header | SRS | Normal Data |
| 1 | 3 | 2 | S | 182-S |

DIGITAL BROADCASTING SYSTEM AND METHOD

CROSS-REFERENCE TO RELATED APPLICATIONS

This is a Divisional of application Ser. No. 11/504,024 filed on Aug. 15, 2006, which claims the benefit of Korean Application No. 2006-68071 filed on Jul. 20, 2006, in the Korean Intellectual Property Office, and U.S. Provisional Application Nos. 60/728,777 filed on Oct. 21, 2005; 60/734,295 filed on Nov. 8, 2005; 60/738,050 filed on Nov. 21, 2005; 60/739,448 filed on Nov. 25, 2005; and 60/788,707 filed on Apr. 4, 2006, the disclosures of which are incorporated herein by reference.

BACKGROUND OF THE INVENTION

1. Field of the Invention

An aspect of the present invention relates to a digital broadcasting system and method using a dual transmission stream including a normal stream and a turbo stream for digital broadcasting, and more particularly, to a digital broadcasting system and method for generating and transmitting a dual transmission stream including a normal stream and a turbo stream to be robustly processed to improve reception sensitivity of an Advanced Television Systems Committee Vestigial Sideband (ATSC VSB) way in a United States terrestrial digital television (DTV) system so as to improve a digital broadcasting performance.

2. Description of the Related Art

An Advanced Television Systems Committee (ATSC) Vestigial Side Band (VSB) system, that is an American type digital terrestrial broadcasting system, is a signal carrier type broadcasting system, and uses a field sync signal in the unit of 312 segments. Accordingly, its reception performance is not good in an inferior channel, and particularly, in a Doppler fading channel.

FIG. 1 is a block diagram illustrating the construction of a transmitter/receiver of an ATSC DTV standard in a general American type digital terrestrial broadcasting system. The digital broadcast transmitter of FIG. 1 is an enhanced VSB (EVSB) system proposed by Philips, which forms and transmits a dual stream produced by adding robust data to normal data of the basic ATSC VSB system.

As illustrated in FIG. 1, the digital broadcast transmitter includes a randomizer 11 randomizing a dual stream, a Reed-Solomon (RS) encoder 12 in the form of a concatenated coder that adds parity bytes to the transport stream in order to correct errors that occur, due to the channel characteristic, in a transport process, an interleaver 13 interleaving the RS-encoded data according to a specified pattern, and a ⅔-rate trellis encoder 14 mapping the interleaved data onto 8-level symbols by performing a ⅔-rate trellis encoding of the interleaved data. The digital broadcast transmitter performs an error correction coding of the dual stream.

The digital broadcast transmitter further includes a multiplexer 15 inserting a field sync signal and a segment sync signal into the error-correction-coded data as illustrated in FIG. 2, and a modulator 16 inserting a pilot tone into the data symbols, into which the segment sync signal and the field sync signal have been inserted by adding a specified DC value to the data symbols, performing a VSB modulation of the data symbols by pulse-shaping the data symbols, and up-converting the modulated data symbols into an RF channel band signal to transmit the RF channel band signal.

In the digital broadcast transmitter, the normal data and the robust data are multiplexed (not illustrated) according to a dual stream system and the normal data and the robust data are transmitted through one channel, and the multiplexed data is inputted to the randomizer 11. The input data is randomized through the randomizer 11, outer-encoded through the RS encoder 12 that is an outer encoder, and then distributed through the interleaver 13.

Also, the interleaved data is inner-encoded in the unit of 12 symbols through the trellis encoder 14, and then mapped onto the 8-level symbols. After the field sync signal and the segment sync signal are inserted into the coded data, the data is VSB-modulated by inserting a pilot tone into the data, and converted into an RF signal.

On the other hand, the digital broadcast receiver of FIG. 1 includes a tuner (not illustrated) converting an RF signal received through a channel into a baseband signal, a demodulator 21 performing a sync detection and demodulation of the converted baseband signal, an equalizer 22 compensating for a channel distortion of the demodulated signal occurring due to a multi-path, a Viterbi decoder 23 correcting errors of the equalized signal and decoding the error-corrected signal to symbol data, a deinterleaver 24 rearranging the data distributed by the interleaver 13 of the digital broadcast transmitter, an RS decoder 25 correcting errors, and a derandomizer 26 derandomizing the data corrected through the RS decoder 25 and outputting an MPEG-2 transport stream.

Accordingly, the digital broadcast receiver of FIG. 1 down-converts the RF signal into the baseband signal, demodulates and equalizes the converted signal, and then channel-decodes the demodulated signal to restore the original signal.

FIG. 2 illustrates a VSB data frame for use in the American type digital broadcasting (8-VSB) system, into which a segment sync signal and a field sync signal are inserted. As shown in FIG. 2, one frame is composed of two fields, and each field is composed of one field sync segment, that is the first segment, and 312 data segments. Also, one segment in the VSB data frame corresponds to one MPEG-2 packet, and is composed of a segment sync signal of four symbols and 828 data symbols.

In FIG. 2, the segment sync signal and the field sync signal are used for the synchronization and equalization in the digital broadcast receiver. That is, the field sync signal and the segment sync signal refer to known data between the digital broadcast transmitter and receiver, which is used as a reference signal when the equalization is performed in the receiver side.

The American type digital terrestrial broadcasting system as illustrated in FIG. 1 is a system that can form and transmit a dual stream produced by adding the robust data to the normal data of the existing ATSC VSB system. This system transmits the robust data together with the existing normal data.

However, the American type digital terrestrial broadcasting system of FIG. 1 has almost no effect in improving the inferior reception performance in a multipath channel due to the transmission of the existing normal data, although the American type digital terrestrial broadcasting system transmits the dual stream produced by adding the robust data to the normal data.

That is, the American type digital terrestrial broadcasting system has almost no effect in improving the reception performance according to the improvement of the normal stream. Also, even with respect to a turbo stream, it does not have a great effect in improving the reception performance in a multipath environment.

In addition, according to the conventional digital broadcasting system, it is impossible to confirm the channel state between a transmitter side and a receiver side.

SUMMARY OF THE INVENTION

Accordingly, the present general inventive concept has been made to solve the above-mentioned and/or other problems, and an aspect of the present general inventive concept is to provide a digital broadcasting system and method capable of improving reception sensitivity of an Advanced Television Systems Committee Vestigial Sideband (ATSC VSB) way in a United States terrestrial digital television (DTV) system.

According to an aspect of the present invention, there is provided a digital broadcasting system including: a transmission stream generator multiplexing a normal stream and a turbo stream to generate a dual transmission stream; a transmitter inserting a supplementary reference signal (SRS) into the dual transmission stream, processing the turbo stream to reconstitute the dual transmission stream, and outputting the reconstituted dual transmission stream; and a receiver receiving the reconstituted dual transmission stream, separately turbo decoding the turbo stream, inserting the turbo decode turbo stream into the dual transmission stream, and decoding the dual transmission stream into which the turbo decoded turbo stream has been inserted, to restore normal stream data and turbo stream data.

The transmission stream generator may include: an Reed-Solomon (RS) encoder receiving the turbo stream from an external source and RS encoding the turbo stream; a duplicator forming a parity insertion area in the RS encoded turbo stream; and a multiplexer receiving the normal stream from an external source and multiplexing the turbo stream processed by the duplicator and the normal stream to generate the dual transmission stream.

The duplicator may convert each byte of the turbo stream using a ½ rate conversion method or a ¼ rate conversion method to form the parity insertion area between data bits of the turbo stream.

The transmitter may include: a randomizer receiving the dual transmission stream from the transmission stream generator and randomizing the dual transmission stream; an SRS inserter inserting an SRS into a stuffing area formed in the randomized dual transmission stream; an RS encoder encoding the dual transmission stream into which the SRS has been inserted; an interleaver interleaving the encoded dual transmission stream; a turbo processor detecting the turbo stream from the interleaved dual transmission stream, encoding the detected turbo stream, stuffing the encoded turbo stream into the dual transmission stream, and compensating for parity corresponding to the encoded turbo stream; and a trellis and/or parity corrector trellis encoding the dual transmission stream processed by the turbo processor.

The turbo processor may include: a turbo stream detector detecting the turbo stream from the interleaved dual transmission stream; an outer encoder inserting parity corresponding to the detected turbo stream into the parity insertion area of the turbo stream; an outer interleaver interleaving the turbo stream into which the parity has been inserted; a turbo stream stuffer inserting the interleaved turbo stream into the dual transmission stream to reconstitute the dual transmission stream; and a parity compensator regenerating parity of the reconstituted dual transmission stream and adding the parity to the dual transmission stream.

The turbo processor further includes: a byte-symbol converter converting the interleaved dual transmission stream from a byte unit into a symbol unit; and a symbol-byte converter converting the dual transmission stream including the parity regenerated by the parity compensator from a symbol unit into a byte unit.

The transmitter may further include: a multiplexer adding a sync signal to the trellis encoded dual transmission stream; a pilot inserter inserting a pilot into the dual transmission stream to which the sync signal has been added; a pre-equalizer equalizing the dual transmission stream into which the pilot has been inserted; a Vestigial Sideband (VSB) modulator VSB modulating the equalized dual transmission stream; and a radio frequency (RF) modulator modulating the VSB modulated dual transmission stream into a signal in an RF channel band and transmitting the signal.

The trellis and/or parity corrector may perform an initialization before encoding the SRS and compensates for the parity according to a value changed by the initialization.

The trellis and/or parity corrector may include: a trellis encoder block performing the initialization and outputting a pre-stored value as an initial value if an external control signal corresponding to an initialization section is received; an RS re-encoder generating parity corresponding to the initial value; an adder adding the parity generated by the RS re-encoder to the dual transmission stream to correct parity of the dual transmission stream; a multiplexer providing the dual transmission stream including the parity corrected by the adder to the trellis encoder block; and a mapper symbol mapping and outputting the dual transmission stream trellis encoded by the trellis encoder block.

The trellis encoder block may include: a plurality of trellis encoders; a splitter sequentially inputting the dual transmission stream into the plurality of trellis encoders; and an encoding output unit sequentially detecting values encoded by the plurality of trellis encoders.

Each of the plurality of trellis encoders may include: a first memory initialized and outputting a pre-stored value as a first initial value if the external control signal is input; a second memory; and a third memory initialized to shift a pre-stored value to the second memory so as to output a value pre-stored in the second memory as a second initial value if the external control signal is input, wherein the RS re-encoder generates parity corresponding to an initial value including a combination of the first and second initial values.

The receiver may include: a demodulator receiving and demodulating the dual transmission stream including the turbo stream and the normal stream; an equalizer equalizing the demodulated dual transmission stream; a Viterbi decoder decoding the normal stream of the equalized dual transmission stream; a turbo decoder decoding the turbo stream of the equalized dual transmission stream; a turbo inserter inserting the turbo stream decoded by the turbo decoder into the dual transmission stream output from the Viterbi decoder; a deinterleaver deinterleaving the dual transmission stream processed by the turbo inserter; an RS decoder RS decoding the deinterleaved dual transmission stream; a derandomizer derandomizing the RS decoded dual transmission stream; and a turbo demultiplexer demultiplexing the derandomized dual transmission stream to restore a normal stream packet and a turbo stream packet.

The turbo decoder may include: a trellis decoder trellis decoding the turbo stream of the equalized dual transmission stream; an outer deinterleaver deinterleaving the trellis decoded turbo stream; an outer map decoder decoding the deinterleaved turbo stream; an outer interleaver interleaving the turbo stream decoded by the outer map decoder and providing the interleaved turbo stream to the trellis decoder if the outer map decoder outputs a soft decision output value; and a frame formatter frame formatting a hard decision output value output from the outer map decoder.

The turbo decoder may further include a symbol deinterleaver converting the frame formatted turbo stream from a symbol unit into a byte unit and providing the turbo stream to the turbo inserter.

The turbo demultiplexer may include: a transmission stream (TS) demultiplexer demultiplexing the dual transmission stream to output the normal stream and the turbo stream; a first sync signal inserter inserting a sync signal into the normal stream output from the TS demultiplexer and outputting the normal stream including the sync signal; a condenser removing a placeholder from the turbo stream output from the TS demultiplexer; an RS decoder RS decoding the turbo stream from which the placeholder has been removed; and a second sync signal inserter inserting a sync signal into the RS decoded turbo stream and outputting the turbo stream including the sync signal.

The turbo demultiplexer may include: a TS demultiplexer demultiplexing the dual transmission stream to output the normal stream and the turbo stream; a sync signal inserter inserting a sync signal into the normal stream output from the TS demultiplexer and outputting the normal stream including the sync signal; a condenser removing a placeholder from the turbo stream output from the TS demultiplexer; a sync signal detector detecting a sync signal from the turbo stream from which the placeholder has been removed; and an RS decoder RS decoding the turbo stream from the detected sync signal up to a predetermined length and outputting the decoded turbo stream.

According to another aspect of the present invention, there is provided a digital broadcasting method including: multiplexing a normal stream and a turbo stream to generate a dual transmission stream; inserting an SRS into the dual transmission stream, processing the turbo stream to reconstitute the dual transmission stream, and outputting the reconstituted dual transmission stream; and receiving the reconstituted dual transmission stream, separately turbo decoding the turbo stream, inserting the turbo decoded turbo stream into the dual transmission stream, and decoding the dual transmission stream into which the turbo decoded turbo stream has been inserted, to restore normal stream data and turbo stream data.

The multiplexing of the normal stream and the turbo stream to generate the dual transmission stream may include: receiving the turbo stream from an external source and RS encoding the turbo stream; forming a parity insertion area in the RS encoded turbo stream; and receiving the normal stream from an external source and multiplexing the turbo stream including the parity insertion area and the normal stream to generate the dual transmission stream.

Each byte of the turbo stream may be converted using a ½ rate conversion method or a ¼ rate conversion method to form the parity insertion area between data bits of the turbo stream.

The inserting of the SRS into the dual transmission stream, processing the turbo stream to reconstitute the dual transmission stream, and the outputting of the reconstituted dual transmission stream may include: randomizing the generated dual transmission stream; inserting the SRS into a stuffing area formed in the randomized dual transmission stream; encoding the dual transmission stream into which the SRS has been inserted; interleaving the encoded dual transmission stream; detecting the turbo stream from the interleaved dual transmission stream, encoding the turbo stream, stuffing the encoded turbo stream into the dual transmission stream, and compensating for parity corresponding to the encoded turbo stream; and trellis encoding the turbo processed dual transmission stream.

The detecting of the turbo stream from the interleaved dual transmission stream, the encoding of the turbo stream, the stuffing of the encoded turbo stream into the dual transmission stream, and the compensating for the parity corresponding to the encoded turbo stream may include: detecting the turbo stream from the interleaved dual transmission stream; inserting parity corresponding to the detected turbo stream into the parity insertion area of the turbo stream; interleaving the turbo stream into which the parity has been inserted; inserting the interleaved turbo stream into the dual transmission stream to reconstitute the dual transmission stream; and regenerating parity of the reconstituted dual transmission stream and adding the parity to the dual transmission stream to compensate for the parity.

The detecting of the turbo stream from the interleaved dual transmission stream, the encoding of the turbo stream, the stuffing of the encoded turbo stream into the dual transmission stream, and the compensating for the parity corresponding to the encoded turbo stream may further include: converting the interleaved dual transmission stream from a byte unit into a symbol unit; and converting the dual transmission stream including the regenerated parity from a symbol unit into a byte unit.

The inserting of the SRS into the dual transmission stream, processing the turbo stream to reconstitute the dual transmission stream, and the outputting of the reconstituted dual transmission stream may further include: adding a sync signal to the trellis encoded dual transmission stream; inserting a pilot into the dual transmission stream to which the sync signal has been added; equalizing the dual transmission stream into which the pilot has been inserted; VSB modulating the equalized dual transmission stream; and modulating the VSB modulated dual transmission stream into a signal in an RF channel band and transmitting the signal.

In the trellis encoding, an initialization may be performed before the SRS is encoded and the parity may be compensated for according to a value changed by the initialization.

The receiving of the reconstituted dual transmission stream, the separately turbo decoding of the turbo stream, the inserting of the turbo decode turbo stream into the dual transmission stream, and the decoding of the dual transmission stream into which the turbo decoded turbo stream has been inserted, to restore normal stream data and turbo stream data may include: receiving and demodulating the dual transmission stream including the turbo stream and the normal stream; equalizing the demodulated dual transmission stream; Viterbi decoding the normal stream of the equalized dual transmission stream; turbo decoding the turbo stream of the equalized dual transmission stream; inserting the turbo decoded turbo stream into the Viterbi decoded dual transmission stream; deinterleaving the dual transmission stream into which the turbo decoded turbo stream has been inserted; RS decoding the deinterleaved dual transmission stream; derandomizing the RS decoded dual transmission stream; and demultiplexing the derandomized dual transmission stream to restore a normal stream packet and a turbo stream packet.

The turbo decoding of the turbo stream of the equalized dual transmission stream may include: trellis decoding the turbo stream of the equalized dual transmission stream; deinterleaving the trellis decoded turbo stream; decoding the deinterleaved turbo stream; and if a hard decision output value is output during the decoding of the deinterleaved turbo stream, frame formatting the hard decision output value, wherein the trellis decoding of the turbo stream of the equalized dual transmission stream, the deinterleaving of the trellis decoded turbo stream, and the decoding of the deinterleaved turbo stream are repeated until the hard decision output value is output during the decoding of the deinterleaved turbo stream.

The turbo decoding of the turbo stream of the equalized dual transmission stream may further include converting the frame formatted turbo stream from a symbol unit into a byte unit.

The demultiplexing of the derandomized dual transmission stream to restore the normal stream packet and the turbo stream packet may include: demultiplexing the dual transmission stream to split the normal stream and the turbo stream from the dual transmission stream; inserting a sync signal into the split normal stream and outputting the normal stream including the sync signal; removing a placeholder from the split turbo stream and RS decoding the turbo stream; and inserting a sync signal into the RS decoded turbo stream and outputting the inserted sync signal.

The demultiplexing of the derandomized dual transmission stream to restore the normal stream packet and the turbo stream packet may include: demultiplexing the dual transmission stream to split the normal stream and the turbo stream from the dual transmission stream; inserting a sync signal into the split normal stream and outputting the normal stream including the sync signal; removing a placeholder from the split turbo stream and RS decoding the turbo stream; and detecting a sync signal from the turbo stream from which the placeholder has been removed, RS decoding the turbo stream from the detected sync signal up to a predetermined length, and outputting the RS decoded turbo stream.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
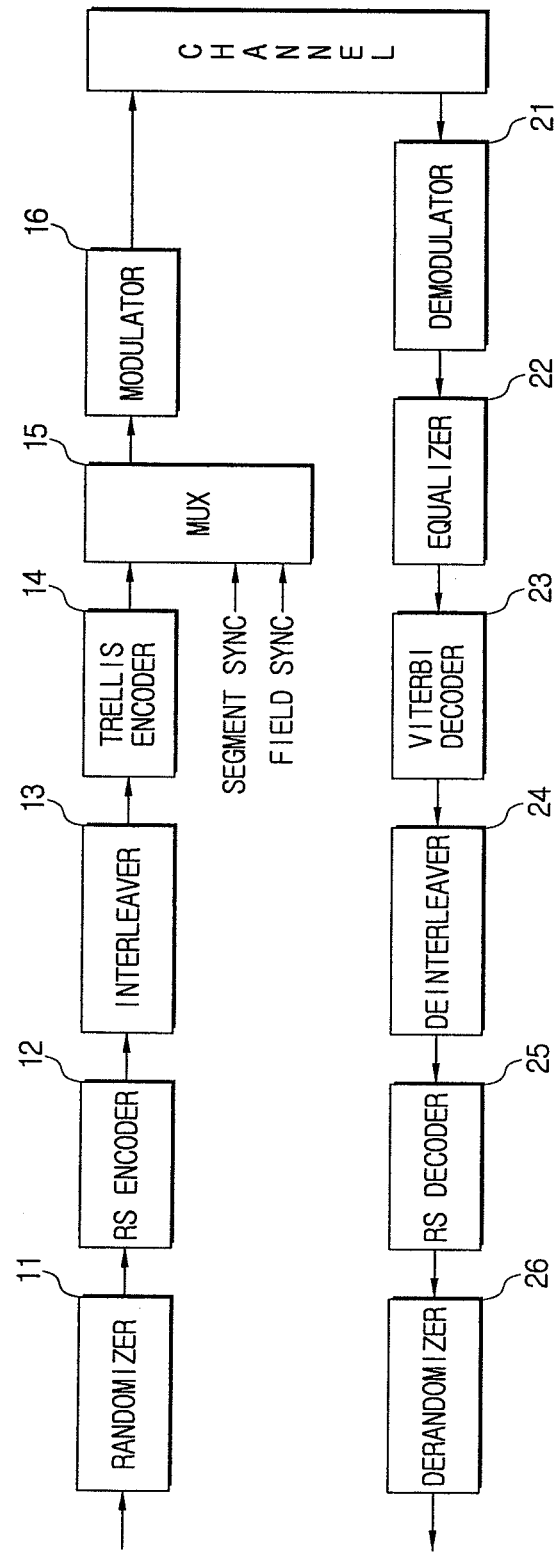
FIG. 1 is a block diagram illustrating a configuration of a conventional digital broadcasting (ATSC VSB) transmitting and receiving system.
Figure 2:
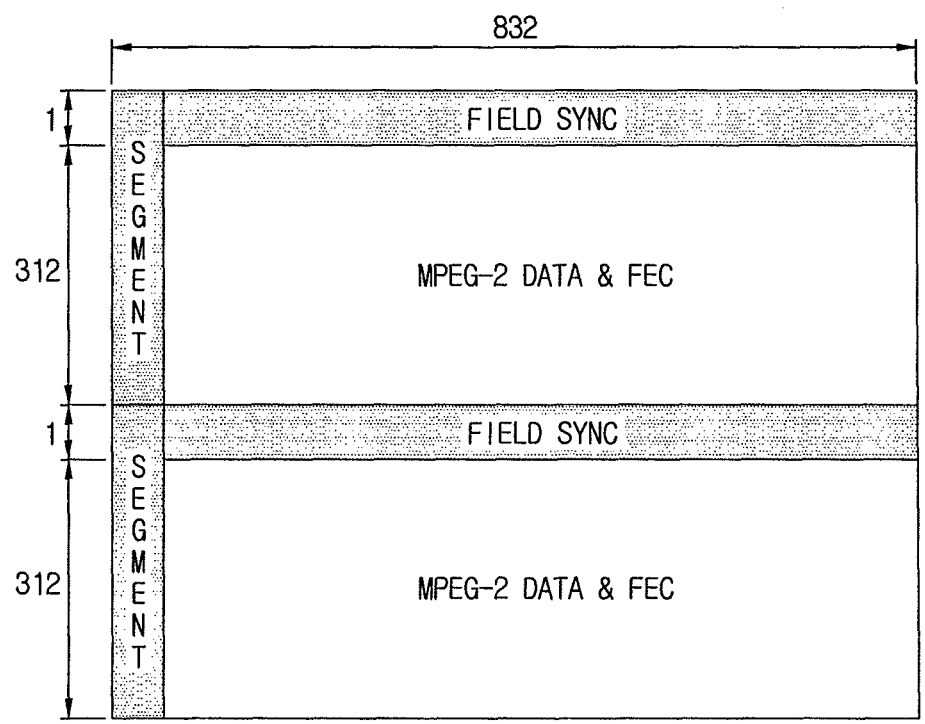
FIG. 2 is a view illustrating a frame structure of conventional Advanced Television Systems Committee Vestigial Sideband (ATSC VSB) data.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 3:
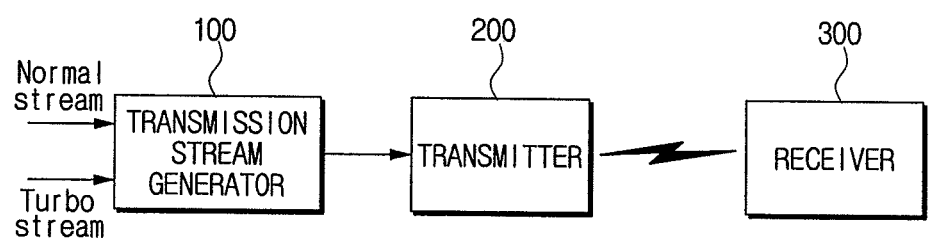
FIG. 3 is a block diagram illustrating a configuration of a digital broadcasting system according to an embodiment of the present invention.

FIG. 3 is a block diagram illustrating a configuration of a digital broadcasting system according to an embodiment of the present invention. Referring to FIG. 3, the digital broadcasting system includes a transmission stream generator 100, a transmitter 200, and a receiver 300.

The transmission stream generator 100 receives and multiplexes a normal stream and a turbo stream to generate a dual transmission stream.

Figure 4:
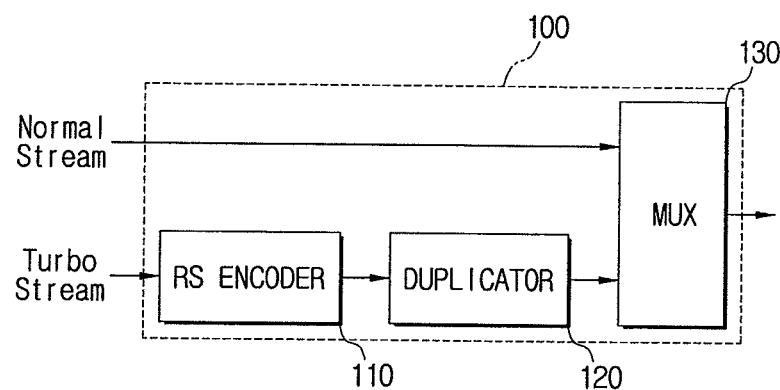
FIG. 4 is a block diagram illustrating a configuration of a transmission stream generator of the digital broadcasting system shown in FIG. 3, according to an embodiment of the present invention.

FIG. 4 is a block diagram illustrating a configuration of the transmission stream generator 100 shown in FIG. 4, according to an embodiment of the present invention. Referring to FIG. 4, the transmission stream generator 100 includes an RS encoder 110, a duplicator 120, and a multiplexer 130.

The RS encoder 110 receives the turbo stream, adds parity to the turbo stream, encodes the turbo stream, and transmits the encoded turbo stream to the duplicator 120.

Figure 5:
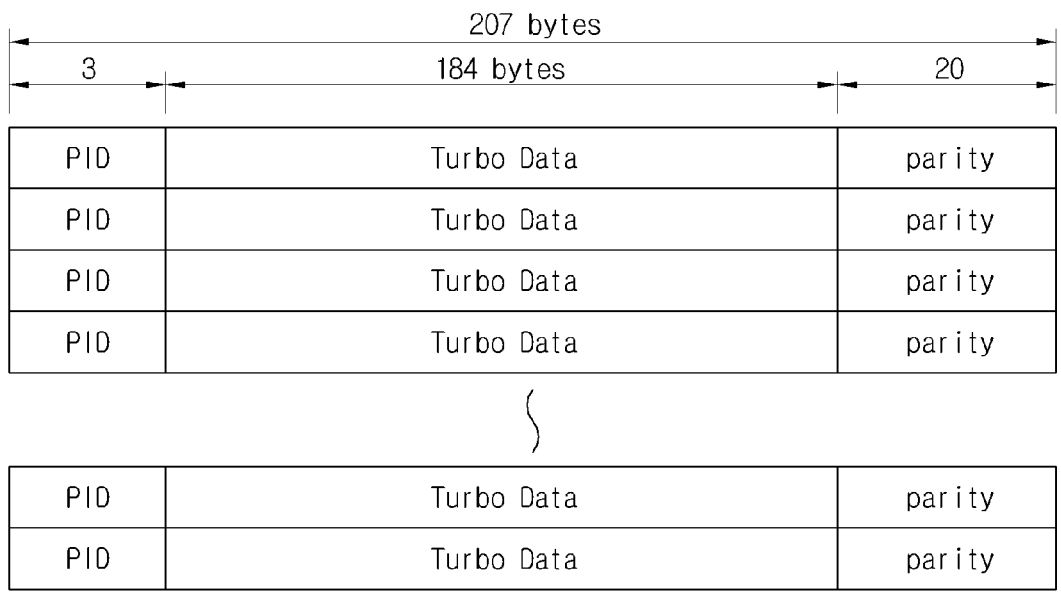
FIG. 5 is a view illustrating a structure of a stream output from an RS encoder of the transmission stream generator shown in FIG. 3, according to an embodiment of the present invention.

FIG. 5 is a view illustrating a structure of a packet encoded by the RS encoder 110 shown in FIG. 4. The RS encoder 110 shown in FIG. 4 receives the turbo stream including a sync signal area, a packet identity (PID) area, and a turbo data area. The whole turbo stream packet may include 188 bytes. Here, a sync signal may be 1 byte, PID may be 3 bytes, and turbo data may be 184 bytes. The RS encoder 110 removes the sync signal from the turbo stream, computes parity of the turbo data area, and adds parity of 20 bytes to the turbo stream. As a result, a packet of the finally encoded turbo stream includes 207 bytes. Here, 3 bytes of 207 bytes are allocated to the PID, 184 bytes are allocated to turbo data, and 20 bytes are allocated to parity.

The duplicator 120 forms parity insertion areas in the encoded turbo stream. A method of forming the parity insertion area will now be described in detail. Bytes of the turbo stream are divided into groups each having 2 bytes or 4 bytes. A portion of bit values of one byte and null data (e.g., "0") are put into each of the groups. Areas into which null data is input are the parity insertion areas.

The operation of the duplicator 120 will now be described in more detail. In other words, if an input is increased to two times and "a, b, c, d, e, f, g, h" are inserted into one byte in order from most significant bits (MSB), an output of the duplicator 120 may be expressed as "a, a, b, b, c, c, d, d, e, e, f, f, g, g, h, h." In this case, one byte including MSBs "a, a, b, b, c, c, d, d" and one byte including bits "e, e, f, f, g, g, h, h" are sequentially output.

If an input is increased to four times, an output of the duplicator 120 may be expressed as "a, a, a, a, b, b, b, b, c, c, c, c, d, d, d, d, e, e, e, e, f, f, f, f, g, g, g, g, h, h, h, h." In other words, 4 bytes are output. The duplicator 120 does not need to necessarily duplicate input bits but may insert a different arbitrary value, i.e., null data, into other positions except designated positions. For example, if the duplicator 120 increases an input to two times, the duplicator 120 may output "a, x, b, x, c, x . . . " instead of "a, a, b, b, c, c, . . . " In other words, the duplicator 120 may maintain an original input value only in a fore part of each of two consecutive bits but may put an arbitrary value into a back part of each of the two consecutive bits.

In an opposite case, the duplicator 120 may maintain an original value only in the back part. If the duplicator 120 increases an output to four times, an original input may be put only into one of first through fourth positions, and an arbitrary value may be put into the other positions.

Figure 6:
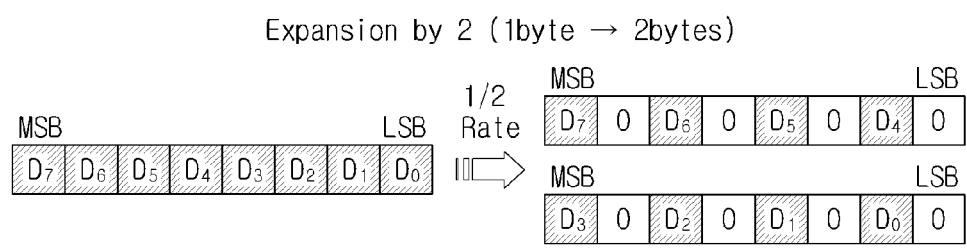
FIGS. 6 and 7 are views illustrating a process of generating parity insertion areas using the transmission stream generator shown in FIG. 4, according to embodiments of the present invention.
Figure 7:
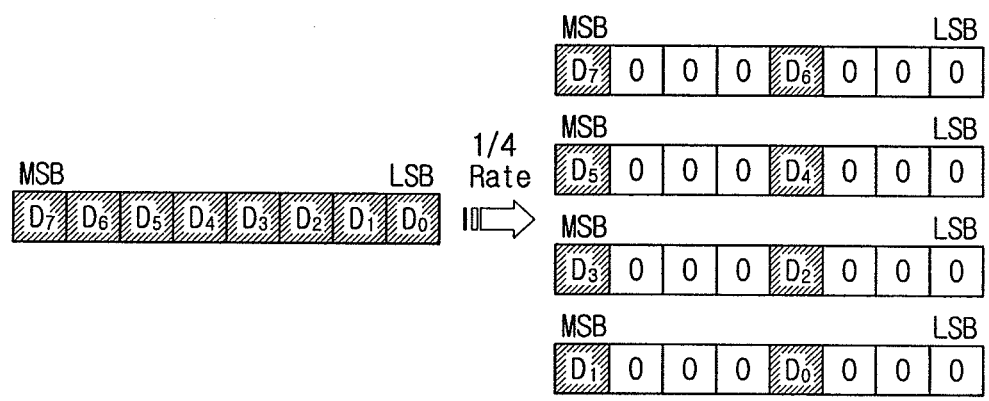

FIGS. 6 and 7 are views illustrating a method of forming parity insertion areas using the duplicator 120, according to an embodiment of the present invention. FIG. 6 illustrates a ½ rate conversion method. The duplicator 120 adopts a ½ rate conversion method to each byte of a turbo stream to generate two bytes. As shown in FIG. 6, one byte including bits $D_0$ through $D_7$ is divided into two bit groups. One of the two bit groups includes 4 bits $D_0$ through $D_3$, and the other one includes 4 bits $D_4$ through $D_7$. In this state, one null bit is arranged with each bit of each of the two bit groups to expand each of the two bit groups to a byte. As a result, a first byte "D7 0 D6 0 D5 0 D4 0" including bits $D_4$ through $D_7$ and a second byte "D3 0 D2 0 D1 0 D0 0" including $D_0$ through $D_3$ are generated. A bit between two bits of each of the first and second bytes is used as a parity insertion area. In other words, second, fourth, sixth, and eighth bits of each of the first and second bytes are used as parity insertion areas. Positions of such parity insertion areas may vary. In other words, second, third, sixth, and seventh bits or third, fourth, fifth, and sixth bits may be used as parity insertion areas.

FIG. 7 illustrates a ¼ rate conversion method. The duplicator 120 adopts a ¼ rate conversion method to each byte of the turbo stream to generate four bytes. Referring to FIG. 7, one byte including bits $D_0$ through $D_7$ is divided into four bit groups each having two bits $D_0$ and $D_1$, $D_2$ and $D_3$, $D_4$ and $D_5$, or $D_6$ and $D_7$. In this state, three null bits are arranged in a line next to each bit of each of the four bit groups to expand each of the four bit groups to a byte. In detail, one byte is expanded to a first byte "D7 0 0 0 D6 0 0 0" including $D_6$ and $D_7$, a second byte "D5 0 0 0 D4 0 0 0" including $D_4$ and $D_5$, a third byte "D3 0 0 0 D2 0 0 0" including $D_2$ and $D_3$, and a fourth byte "D1 0 0 0 D0 0 0 0" including $D_0$ and $D_1$. Referring to FIG. 7, second, third, fourth, sixth, seventh, and eighth bits of each of the four bit groups are used as parity insertion areas, but parity insertion areas are limited to this case.

Referring to FIG. 4, the multiplexer 130 multiplexes the normal stream additionally received and the turbo stream processed by the duplicator 120. Thus, a dual transmission stream including the normal stream and the turbo stream may be generated. The normal stream and the turbo stream may be received from an external module such as a broadcast shooting apparatus or the like or an internal module such as a compression processing module, e.g., a Moving Picture Experts Group-2 (MPEG-2) module, a video encoder, an audio encoder, or the like.

The multiplexer 130 forms an adaptation field in each packet of the dual transmission stream. The adaptation field refers to an area in which a turbo stream or other data is to be inserted. In detail, besides a turbo stream, reset data for initialization, a supplementary reference signal (SRS), or the like may be inserted into the adaptation field. The adaptation field may be used as an option field in which various types of packet information are recorded. Packet information may be a program clock reference (PCR), an original program clock reference (OPCR), four circuit blocks, a splice countdown, a transport private data length, or an adaptation field extension length. The PCR is used for a synchronization of a demodulator of a receiver. The OPCR is used to record, reserve, and play a program in a receiver. The splice countdown is a number of consecutive macro-blocks each including Cr (red chrominance) and Cb (blue chrominance) blocks. The transport private data length is a length of letter data of letter broadcasting. In this case, an area in which a turbo stream is to be recorded may not overlap with the option field.

The transmission stream generator 100 shown in FIG. 4 may further include an interleaver (not shown). In this case, the interleaver may be disposed before or after the duplicator 120. Thus, the RS encoded turbo stream may be interleaved, and then the parity insertion areas may be generated. Alternatively, the turbo stream in which the parity insertion areas have been generated may be interleaved and then provided to the multiplexer 130.

Figure 8:
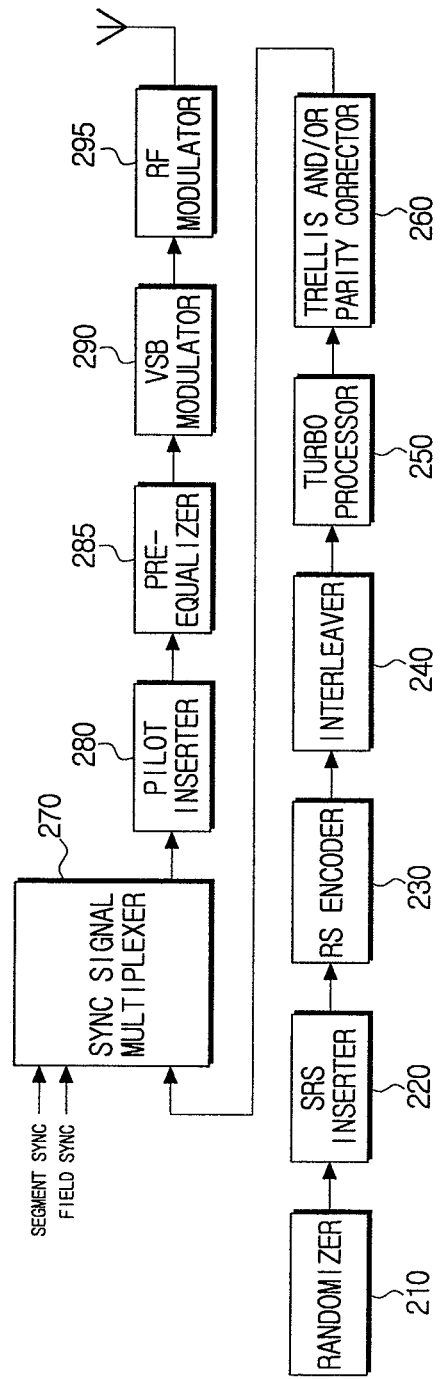
FIG. 8 is a block diagram illustrating a configuration of a transmitter of the digital broadcasting system shown in FIG. 3, according to an embodiment of the present invention.

The transmitter 200 shown in FIG. 3 may be realized as shown in FIG. 8.

Referring to FIG. 8, the transmitter 200 includes a randomizer 210, an SRS inserter 220, an RS encoder 230, an interleaver 240, a turbo processor 250, a trellis and/or parity corrector 260, a sync signal multiplexer 270, a pilot inserter 280, a pre-equalizer 285, a vestigial sideband (VSB) modulator 290, and an RF modulator 295.

The randomizer 210 randomizes the dual transmission stream received from the transmission stream generator 100.

The SRS inserter 220 receives the dual transmission stream and inserts an SRS into an adaptation field of each packet of the dual transmission stream. The SRS refers to a signal pattern commonly known to a transmitter and a receiver. A broadcasting receiver compares an SRS of a received stream with an existing SRS to easily check a state of a channel. Thus, a degree of a compensation for parity may be determined.

The RS encoder 230 encodes the dual transmission stream into which the SRS has been inserted.

The interleaver 240 interleaves the encoded dual transmission stream.

The turbo processor 250 detects only the turbo stream from the interleaved dual transmission stream, encodes and interleaves the detected turbo stream, and robustly processes the encoded and interleaved turbo stream. Next, the robustly processed turbo stream is stuffed into the dual transmission stream to reconstitute the dual transmission stream. Thereafter, a compensation operation is performed on parity changed by the encoding of the turbo stream. Examples of the configuration of the turbo processor 250 are shown in FIGS. 9 and 10.

Figure 9:
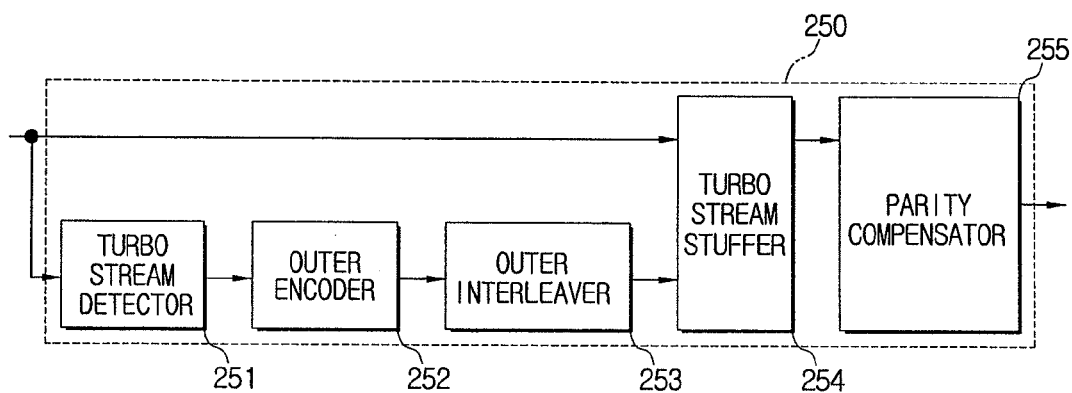
FIGS. 9 and 10 are block diagrams illustrating a configuration of a turbo processor used in the transmitter shown in FIG. 8, according to embodiments of the present invention.
Figure 10:
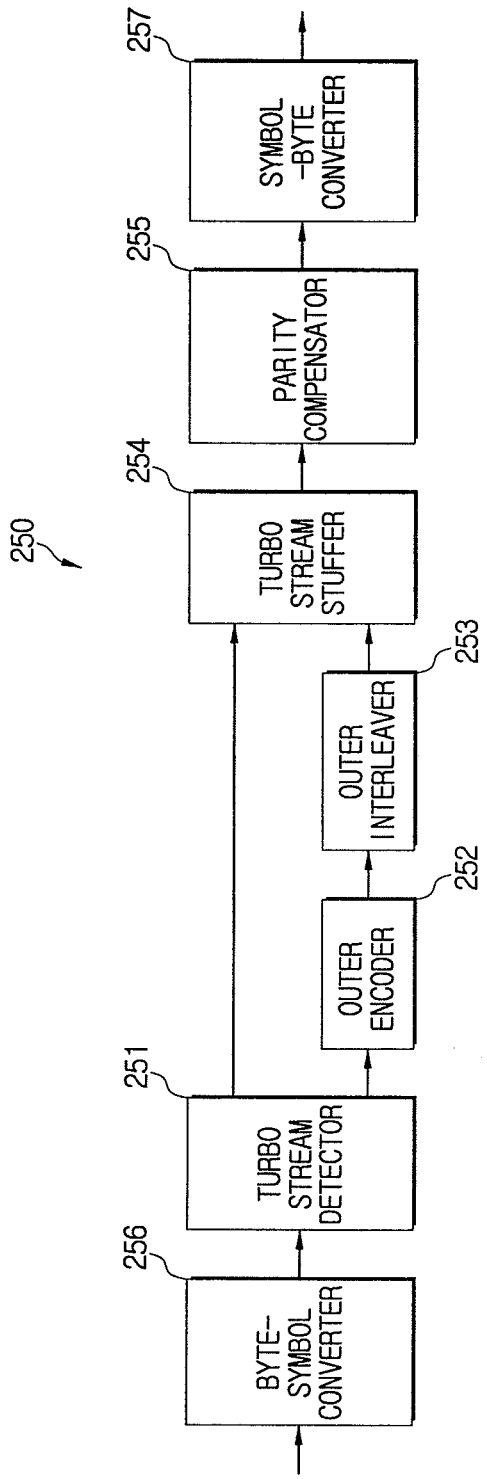

Referring to FIG. 9, the turbo processor 250 includes a turbo stream detector 251, an outer encoder 252, an outer interleaver 253, a turbo stream stuffer 254, and a parity compensator 255.

The turbo stream detector 251 detects the turbo stream from the dual transmission stream.

The outer encoder 252 adds parity into the parity insertion areas of the detected turbo stream to encode the turbo stream.

The outer interleaver 253 interleaves the encoded turbo stream.

The turbo stream stuffer 254 multiplexes the interleaved turbo stream and the normal stream to reconstitute the dual transmission stream. The turbo stream stuffer 254 may be realized as a multiplexer.

The parity compensator 255 regenerates parity of the reconstituted dual transmission stream and adds the parity to the dual transmission stream so as to compensate for a parity error caused by the encoding of the turbo stream.

FIG. 10 is a block diagram illustrating a configuration of the turbo processor 250 according to another embodiment of the present invention. Referring to FIG. 10, the turbo processor 250 may further include a byte-symbol converter 256 and a symbol-byte converter 257 besides a turbo stream detector 251, an outer encoder 252, an outer interleaver 253, a turbo stream stuffer 254, and a parity compensator 255.

The byte-symbol converter 256 converts the dual transmission stream interleaved by the interleaver 240 from a byte unit into a symbol unit. The conversion from the byte unit into the symbol unit may be easily understood with reference to Table D5.2 of "US ATSC DTV Standards (A/53)." The turbo stream detector 251 detects the turbo stream from the dual transmission stream which has been converted into the symbol unit. The outer encoder 252 computes parity of the detected turbo stream and inserts the parity into a parity insertion area to encode the turbo stream. In this case, the outer encoder 252 encodes the turbo stream in the unit of byte.

The outer interleaver 253 interleaves the encoded turbo stream. In this case, the outer interleaver 253 interleaves the encoded turbo stream in the unit of bit.

The turbo stream stuffer 254 multiplexes the interleaved turbo stream and the normal stream to constitute the dual transmission stream. In detail, the turbo stream stuffer 254 stuffs the turbo stream into a position of the turbo stream which is not detected by the turbo stream detector 251 to constitute the dual transmission stream.

The symbol-byte converter 257 converts the dual transmission stream from a symbol unit into a byte unit. The conversion from the symbol unit into the byte unit may be easily understood with reference to Table D5.2 of "US ATSC DTV Standards (A/53)."

Figure 11:
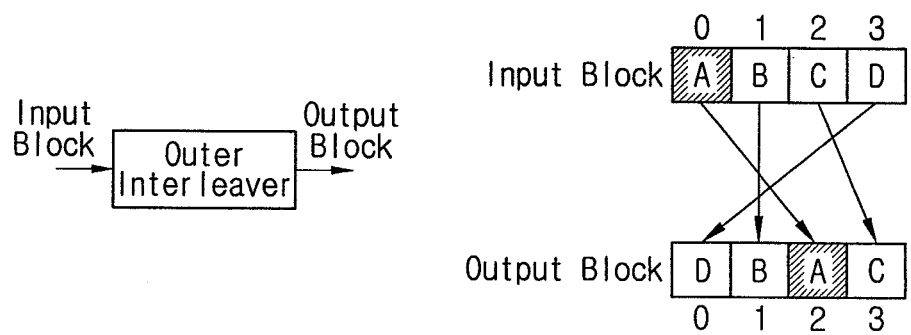
FIG. 11 is a view illustrating an operation of an outer interleaver used in a turbo processor according to an embodiment of the present invention.

FIG. 11 is a view illustrating an interleaving process performed by the outer interleaver 253. Referring to FIG. 11, the outer interleaver 253 performs interleaving according to a predetermined interleaving rule. For example, the predetermined interleaving rule is {0, 1, 2, 3}=>{2, 1, 3, 0} and "A, B, C, and D" are sequentially input, "A, B, C, and D" are interleaved and output in the format of "DBAC."

Referring to FIG. 8, the turbo processed dual transmission stream is trellis encoded by the trellis and/or parity corrector 260. The trellis and/or parity corrector 260 also corrects parity changed by the trellis encoding.

Figure 12:
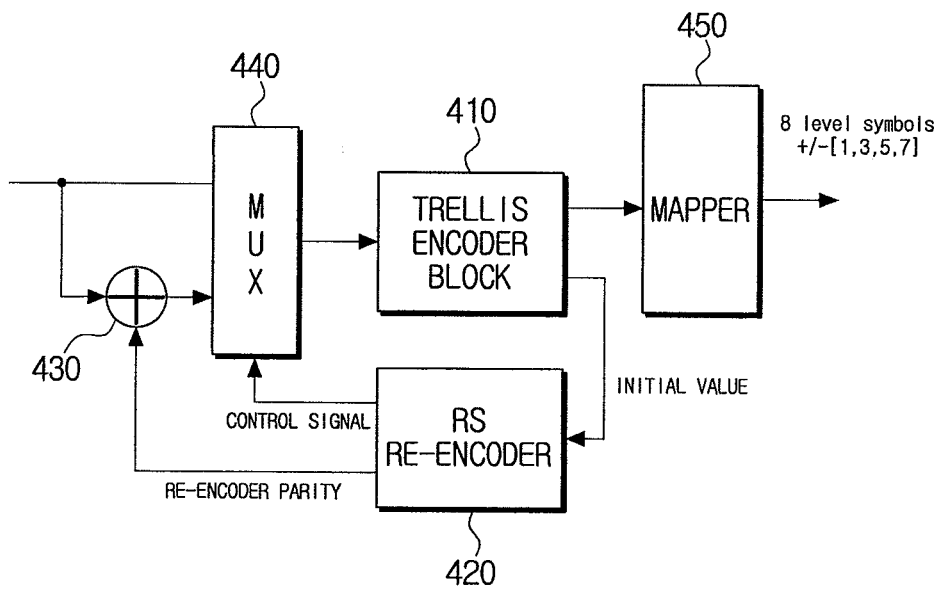
FIG. 12 is a block diagram illustrating a configuration of a trellis and/or parity corrector used in the transmitter shown in FIG. 8, according to an embodiment of the present invention.

FIG. 12 is a block diagram illustrating a configuration of the trellis and/or parity corrector 260 according to an embodiment of the present invention. Referring to FIG. 12, the trellis and/or parity corrector 260 includes a trellis encoder block 410, an RS re-encoder 420, an adder 430, a multiplexer 440 and a mapper 450.

The multiplexer 440 may have an operation mode (referred to as a common mode) in which trellis encoding is performed and an operation mode (referred to as a parity correction mode) in which a packet added by the adder 430 is trellis encoded. The operation modes of the multiplexer 440 depend on a control signal received from the RS re-encoder 420.

The trellis encoder block 410 trellis encodes a packet received from the multiplexer 440. The trellis encoder block 410 may trellis encode the packet according to an external control signal and may be initialized immediately before SRS data of the packet is trellis encoded.

The RS re-encoder 420 regenerates parity corresponding to the changed packet when the trellis encoder block 410 is initialized.

The adder 430 adds the re-encoded parity to the packet received from the turbo processor 250 and provides the addition result to the multiplexer 440. The addition method will now be described.

A) The fore is omitted . . . 101001010111 001010101011AAAAA . . . The rest is omitted.
B̄) The fore is omitted . . . 000000000000 010000000000BBBBB . . . The rest is omitted.
C̄) The fore is omitted . . . 101001010111 011010101011CCCCC . . . The rest is omitted.

A) indicates a packet received from the turbo processor 250, B) indicates an RS re-encoded packet, and C) indicates a packet obtained by performing exclusive OR on the received packet and the RS re-encoded packet using the adder 430. When an underlined part of the received packet of A) is input to the trellis encoder block 410, the trellis encoder block 410 is initialized. In this case, a value corresponding to a value pre-stored in the trellis encoder block 410 is provided to the RS re-encoder 420, and the RS re-encoder 420 adds parity to the provided value to output the RS re-encoded packet of B). An underline part of the RS re-encoded packet of B) represents a changed value corresponding to the underlined part of the received packet of A). Parity corresponding to the underline part of the RS re-encoded packet of B) is regenerated as "BBBBB."

The adder 430 performs the exclusive OR on the received packet of A) and the RS re-encoded packet of B) to output the packet of C). Considering the packet of C), the underlined part of the received packet of A) is changed into "01" in the packet of C), and parity of the received packet of A) is changed from "AAAAA" into "CCCCC" in the packet of C).

When initialization and parity correction are completed, the multiplexer 440 operates in a general operation mode to provide the dual transmission stream to the trellis encoder block 410.

The mapper 450 maps the trellis encoded packet into 8-level symbols and outputs the 8-level symbols. In detail, the mapper 450 may map the trellis encoded packet as shown in Table 1 below.

TABLE 1

| Z2 | Z1 | Z0 | R |
|---|---|---|---|
| 0 | 0 | 0 | −7 |
| 0 | 0 | 1 | −5 |
| 0 | 1 | 0 | −3 |

TABLE 1-continued

| Z2 | Z1 | Z0 | R |
|---|---|---|---|
| 0 | 1 | 1 | −1 |
| 1 | 0 | 0 | +1 |
| 1 | 0 | 1 | +3 |
| 1 | 1 | 0 | +5 |
| 1 | 1 | 1 | +7 |

As shown in Table 1 above, Z0, Z1, and Z2 are trellis encoding values output from the trellis encoder block 410, and R represents mapping output values corresponding to the trellis encoding values. In other words, if the trellis encoding values are output as "0, 0, 0," the mapper 450 outputs "−7" as a mapping output value.

Figure 13:
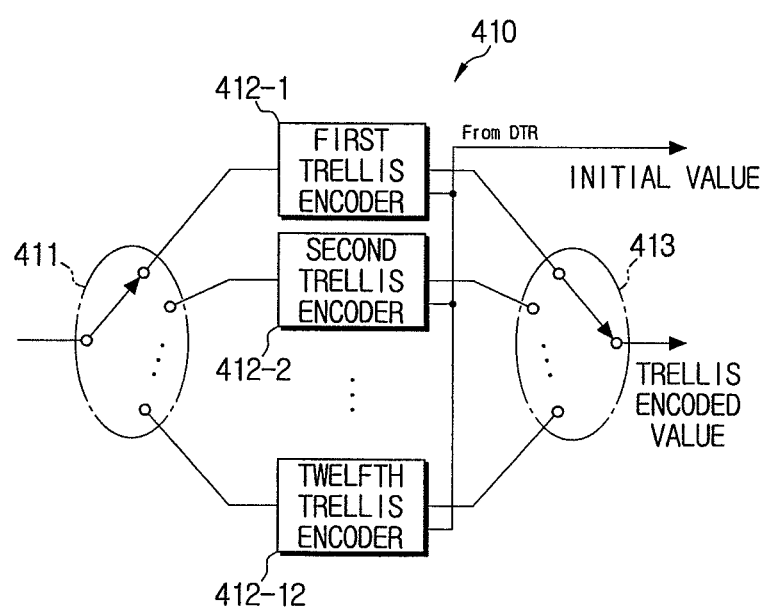
FIG. 13 is a block diagram illustrating a configuration of a trellis encoder block used in the trellis and/or parity corrector shown in FIG. 12, according to an embodiment of the present invention.

FIG. 13 is a block diagram illustrating a configuration of the trellis encoder block 410 according to an embodiment of the present invention. Referring to FIG. 13, the trellis encoder block 410 includes a splitter 411, a plurality of trellis encoders 412-1 through 412-12, and an encoding output unit 413.

The splitter 411 sequentially outputs streams output from the multiplexer 440 to the plurality of trellis encoders 412-1 through 412-12. In this case, the streams may be output in the unit of byte.

The plurality of trellis encoders 412-1 through 412-12 trellis encode and output the streams. In this case, the trellis encoders 412-1 through 412-12 are sequentially selected to sequentially output trellis encoding values of the trellis encoders 412-1 through 412-12. During an initial section, the trellis encoders 412-1 through 412-12 provide values pre-stored in memories (not shown) of the trellis encoders 412-1 through 412-12 as initial values to the RS re-encoder 420. The RS re-encoder 420 adds parity to the provided initial values and outputs the addition result to the adder 430 to correct the parity.

The encoding output unit 413 sequentially detects the trellis encoding values output from the trellis encoders 412-1 through 412-12 and outputs the trellis encoding values to the mapper 450.

The trellis encoders 412-1 through 412-12 each includes a plurality of memories (not shown) and perform trellis encoding using the memories. In this case, initialization is performed immediately before an area, with an SRS, is trellis encoded. The memories are reset by the initialization. In this process, values pre-stored in the memories are provided as initial values to the RS re-encoder 420.

In detail, each of the trellis encoders 412-1 through 412-12 may include three memories, i.e., first through third memories (not shown). When the initialization is performed, the first memory outputs a pre-stored value as an initial value (referred to as a first initial value). Also, the third memory is initialized and simultaneously shifts a pre-stored value to the second memory. A value pre-stored in the second memory is output as an initial value (referred to as a second initial value) according to the shifting operation. The RS re-encoder 420 combines the first and second values and uses the combined value as an initial value.

The second and third memories are arranged in a line to perform shifting operations. Thus, a control signal having 2 symbols is required to initialize the second and third memories. Also, 8 initial value states "000," "111," "001," "010," "100," "110," "101," "011" may be formed using the three memories. Values "X0" and "X1" indicating the first and second initial values may be provided to the RS re-encoder 420 to change parity.

Referring to FIG. 8, the sync signal multiplexer 270 adds a segment sync signal and a field sync signal to the trellis encoded dual transmission stream and multiplexes the dual transmission stream.

The pilot inserter 280 adds a predetermined DC value to the dual transmission stream to which the segment sync signal and the field sync signal have been added to insert a pilot into the dual transmission stream.

The pre-equalizer 285 equalizes the dual transmission stream into which the pilot has been inserted so as to minimize an inter-symbol interference (ISI).

The VSB modulator 290 VSB modulates the equalized dual transmission stream.

The RF modulator 295 modulates the VSB modulated dual transmission stream into a signal in an RF channel band and outputs the signal.

Figure 14:
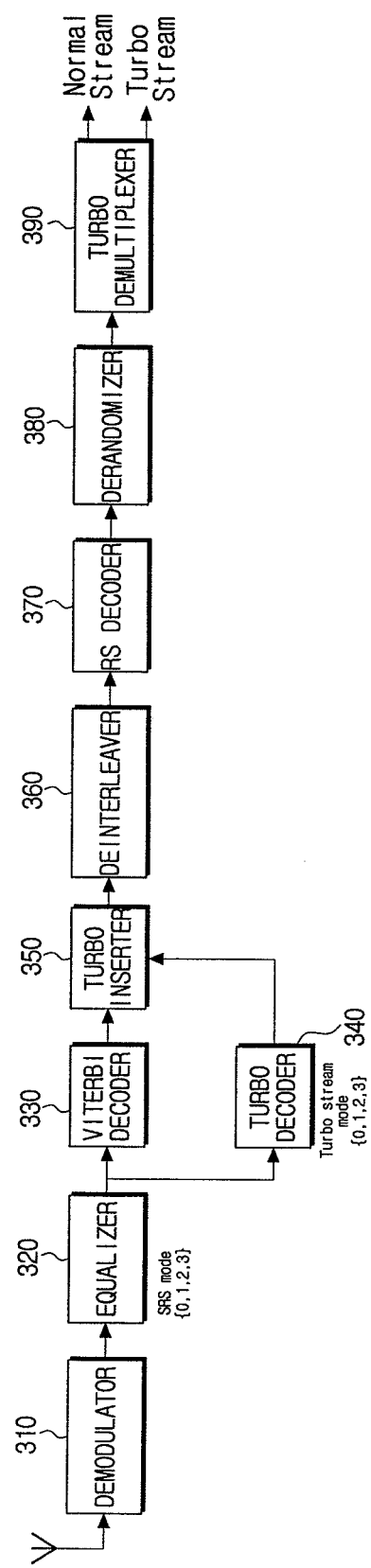
FIG. 14 is a block diagram illustrating a configuration of a receiver of the digital broadcasting system shown in FIG. 3, according to an embodiment of the present invention.

FIG. 14 is a block diagram illustrating a configuration of the receiver 300 of the digital broadcasting system shown in FIG. 3, according to an embodiment of the present invention. Referring to FIG. 14, the receiver 300 includes a demodulator 310, an equalizer 320, a viterbi decoder 330, a turbo decoder 340, a turbo inserter 350, a deinterleaver 360, an RS decoder 370, a derandomizer 380, and a turbo demultiplexer 390.

The demodulator 310 detects synchronization from the dual transmission stream according to the sync signal added to the baseband signal of the dual transmission stream and demodulates the dual transmission stream.

The equalizer 320 equalizes the demodulated dual transmission stream to compensate for a distortion of a channel caused by a multi-path of the channel. The dual transmission stream equalized by the equalizer 320 is provided to the viterbi decoder 330 and the turbo decoder 340.

The Viterbi decoder 330 performs error correction of the equalized dual transmission stream decodes the error-corrected equalized dual transmission stream into error-correction encoded symbols.

The turbo decoder 340 detects only the turbo stream of the equalized dual transmission stream and turbo decodes the turbo stream. Turbo decoding represents a process of decoding the turbo stream. This will be described in detail later.

The turbo inserter 350 inserts the turbo stream turbo decoded by the turbo decoder 340 into the Viterbi decoded dual transmission stream. In this case, the turbo inserter 350 may detect the turbo stream from the turbo decoded dual transmission stream and insert the turbo stream into an area corresponding to the turbo stream of the Viterbi decoded dual transmission stream. The area corresponding to the turbo stream may be a portion of a packet adaptation field or the whole packet adaptation field. The packet adaptation field represents an area which is formed in each packet of a dual transmission stream and in which an SRS, turbo stream data, and the like are to be recorded.

The deinterleaver 360 deinterleaves the dual transmission stream into which the turbo stream has been inserted.

The RS decoder 370 decodes deinterleaved packets to correct an error.

The derandomizer 380 derandomizes the error corrected packets, and the turbo demultiplexer 390 demultiplexes the derandomized packets to restore the normal stream and the turbo stream.

Figure 15:
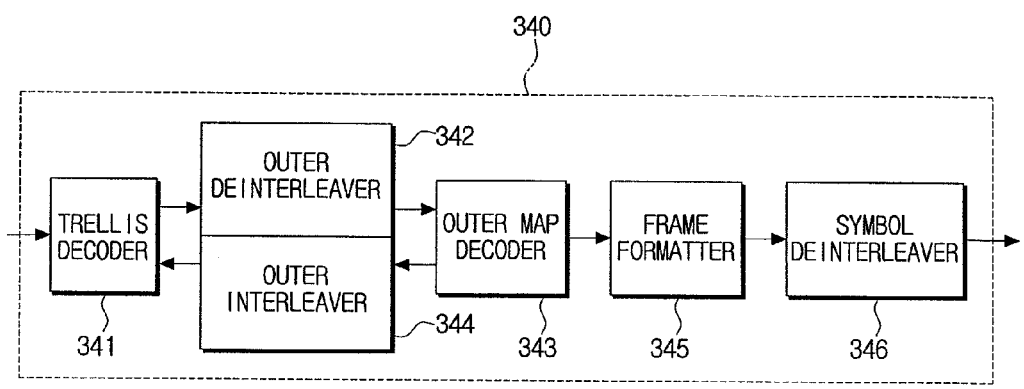
FIG. 15 is a block diagram illustrating a configuration of a turbo decoder shown in FIG. 14, according to an embodiment of the present invention.

FIG. 15 is a block diagram illustrating a configuration of the turbo decoder 340 according to an embodiment of the present invention. Referring to FIG. 15, the turbo decoder 340 includes a trellis decoder 341, an outer deinterleaver 342, an outer map decoder 343, an outer interleaver 344, a frame formatter 345, and a symbol deinterleaver 346.

The trellis decoder 341 trellis decodes the turbo stream of the equalized dual transmission stream and provides the trellis decoded turbo stream to the outer deinterleaver 342.

The outer deinterleaver 342 deinterleaves the trellis decoded turbo stream.

The outer map decoder 343 may convolution decode the deinterleaved turbo stream. The outer map decoder 343 outputs soft decision and hard decision output values depending on the result of convolution decoding. Here, the soft and hard decision output values depend on a matrix of the turbo stream. For example, if the matrix of the turbo stream is "0.8," the soft decision output value is output as "0.8." If the matrix of the turbo stream is "1," the hard decision output value is output.

The hard decision output value of the outer map decoder 343 is provided to the frame formatter 345. In this case, the hard decision output value represents the turbo stream.

The frame formatter 345 formats the convolution decoded hard decision turbo stream to a frame of the dual transmission stream.

The symbol deinterleaver 346 may deinterleave the frame formatted turbo stream from a symbol unit to a byte unit. The deinterleaving from the symbol unit to the byte unit may be easily understood with reference to Table D5.2 of "US ATSC DTV Standards (A/53)", and thus its detailed description will be omitted. The symbol deinterleaver 346 is shown in FIG. 15 but may be omitted.

If the outer map decoder 343 outputs the soft decision output value, the outer interleaver 344 interleaves the turbo stream and provides the interleaved turbo stream to the trellis decoder 341. The trellis decoder 341 trellis decodes the interleaved turbo stream and provides the trellis decoded turbo stream to the outer deinterleaver 342. The outer deinterleaver 342 deinterleaves the trellis decoded turbo stream and provides the deinterleaved turbo stream to the outer map decoder 343. The operations of the trellis decoder 341, the outer deinterleaver 342, and the outer interleaver 344 may be repeatedly performed until the hard decision output value is output. Thus, a reliable decoded value can be obtained.

Figure 16:
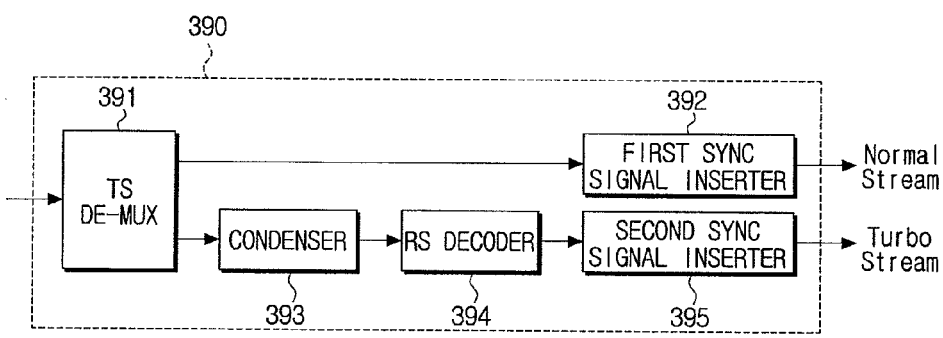
FIGS. 16 and 17 are block diagrams illustrating a configuration of a turbo demultiplexer shown in FIG. 14, according to embodiments of the present invention.

FIG. 16 is a block diagram illustrating a configuration of the turbo demultiplexer 390 of the receiver 300 shown in FIG. 14. Referring to FIG. 16, the turbo demultiplexer 390 includes a transmission stream (TS) demultiplexer 391, a condenser 393, an RS decoder 394, and first and second sync signal inserters 392 and 395.

The TS demultipexer 391 demultipexes the derandomized packets into the normal stream and the turbo stream.

A sync signal is inserted into the normal stream demultiplexed by the TS demultiplexer 391 using the first sync signal inserter 392 to restore the normal stream of 188 bytes.

The condenser 393 removes a placeholder from the deinterleaved turbo stream. The placeholder may be a parity insertion area for RS encoding a turbo stream in a digital broadcasting transmitting system. If the placeholder is formed at a rate of ¼ or ½, a magnitude of the turbo stream may be reduced by the rate of ¼ or ½.

The RS decoder 394 decodes the turbo stream from which the placeholder has been removed.

The second sync signal inserter 395 inserts a sync signal into the decoded turbo stream to restore the turbo stream of 188 bytes. If the sync signal of the turbo stream is removed during the generation of the dual transmission stream, a process of inserting a sync signal using the second sync signal inserter 395 to regenerate the turbo stream is required.

Figure 17:
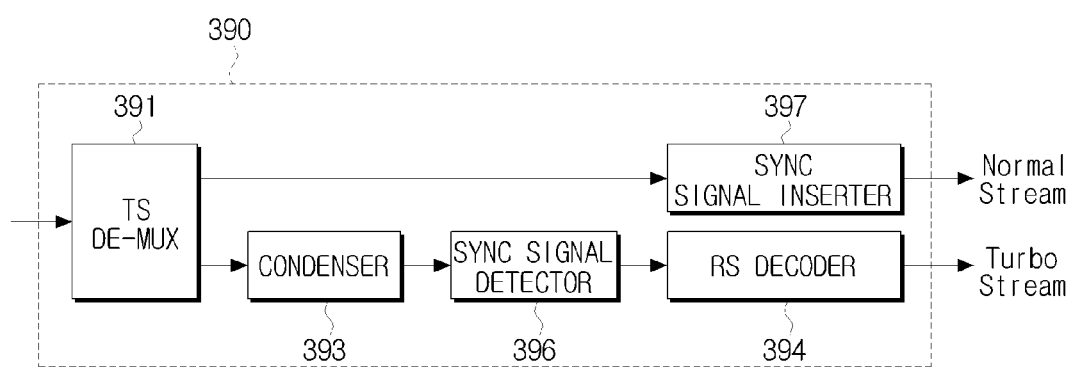

FIG. 17 is a block diagram illustrating a configuration of the turbo demultiplexer 390 according to another embodiment of the present invention. Referring to FIG. 17, the turbo demultiplexer 390 includes a TS demultiplexer 391, a sync signal inserter 397, a condenser 393, an RS decoder 394, and a sync signal detector 396. Different from the description with reference to FIG. 17, a sync signal of the turbo stream may not be removed during the generation of the dual transmission stream. In this case, the sync signal of the turbo stream is also received, and thus a sync signal does not need to be inserted into the decoded turbo stream. However, similar to the description with reference to FIG. 17, the sync signal inserter 397 inserts a sync signal into the normal stream demultiplexed by the TS demultiplexer 391 to restore the normal stream of 188 bytes.

The sync signal detector 396 receives the turbo stream from which the placeholder has been removed, checks a value "0x47" of the sync signal of the received turbo stream, and outputs the turbo stream from a byte after the sync signal up to 187 bytes to the RS decoder 394. Here, the value "0x47" of the sync signal indicates a value of a sync signal existing in each packet, and one packet includes 187 bytes except one byte of the sync signal. The sync signal detector 396 may detect the turbo stream from the value of the sync signal up to 187 bytes.

The RS decoder 394 corrects an error of the turbo stream of 188 bytes from which the sync signal has been detected and restores the turbo stream.

The turbo demultiplexer 390 shown in FIG. 16 or 17 may further include a deinterleaver (not shown). In other words, if the transmission stream generator 100 further includes an interleaver, the turbo demultiplexer 390 of the receiver 300 may further include the deinterleaver.

A digital broadcasting method according to an embodiment of the present invention includes: generating a dual transmission stream including a turbo stream and a normal stream; turbo decoding and transmitting only the turbo stream of the dual transmission stream; and receiving the dual transmission stream to separately decode the normal stream and the turbo stream so as to restore normal stream data and turbo stream data.

Figure 18:
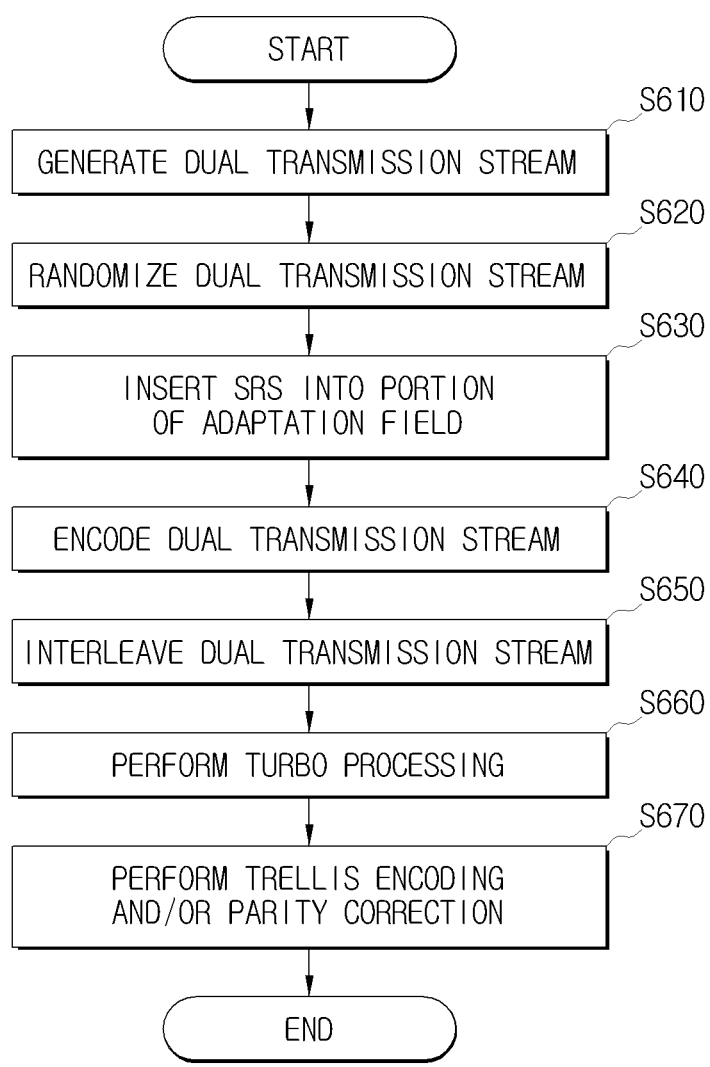
FIG. 18 is a flowchart illustrating a process of transmitting a dual transmission stream according to an embodiment of the present invention.

FIG. 18 is a flowchart illustrating a method of generating and transmitting a dual transmission stream according to an embodiment of the present invention. Referring to FIG. 18, in operation S610, a dual transmission stream is generated. In detail, parity insertion areas are formed in a turbo stream, an adaptation field is formed in a normal stream, and the turbo stream and the normal stream are multiplexed to generate the dual transmission stream.

In operation S620, the dual transmission stream is randomized. In operation S630, an SRS is inserted into a portion of the adaptation field.

In operation S640, the dual transmission stream into which the SRS has been inserted is encoded. In operation S650, the encoded dual transmission stream is interleaved.

In operation S660, turbo processing is performed. The turbo processing is a process where only the turbo stream is detected from the dual transmission stream, encoded, interleaved, and inserted into the dual transmission stream. In this case, operation S660 is performed after operation S640. Thus, a parity compensation operation is additionally performed to prevent parity from varying with the turbo processing.

In operation S670, trellis encoding and/or parity correction are performed. Thereafter, a sync signal is multiplexed, a pilot is inserted into the dual transmission stream, and the dual transmission stream is equalized, modulated, and transmitted. The detailed description of this has been described above and thus will be omitted.

Figure 19:
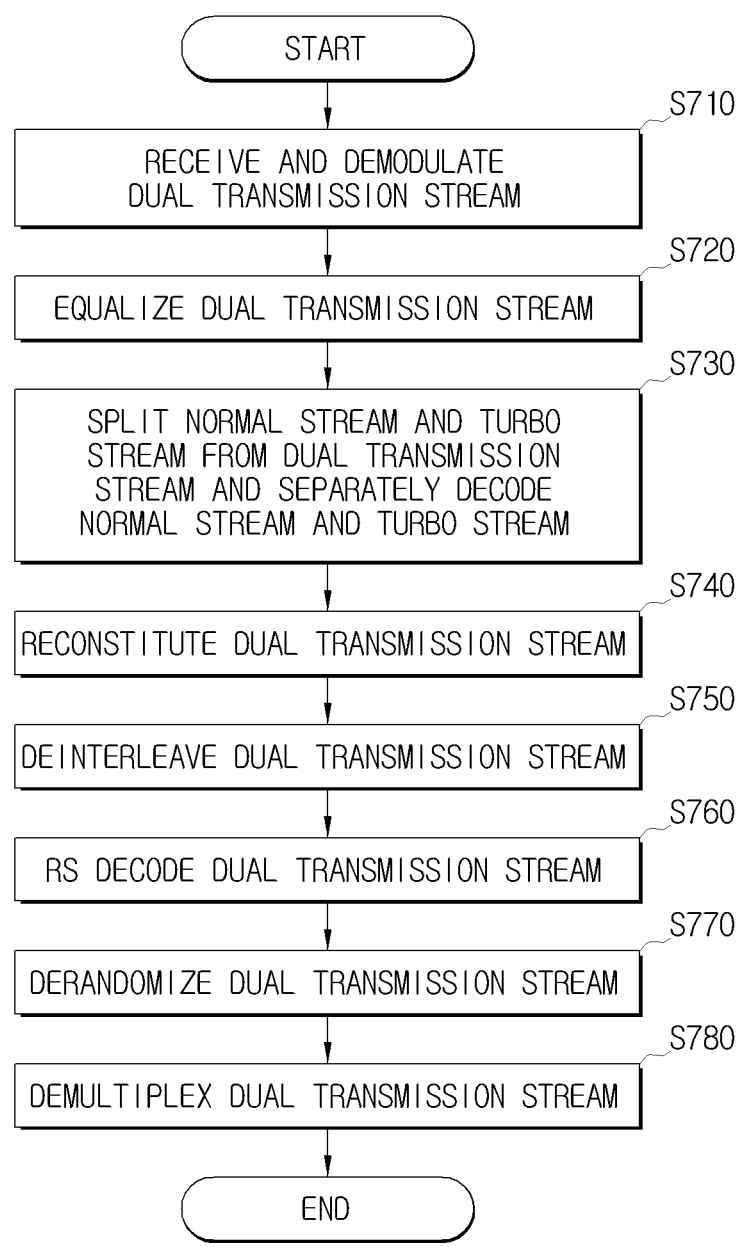
FIG. 19 is a flowchart illustrating a process of receiving a dual transmission stream according to an embodiment of the present invention.

FIG. 19 is a flowchart illustrating a method of receiving a dual transmission stream according to an embodiment of the present invention. Referring to FIG. 19, in operation S710, a dual transmission stream is received and demodulated. In operation S720, the demodulated dual transmission stream is equalized. A normal stream and a turbo stream are split from the equalized dual transmission stream. In operation S730, the normal stream and the turbo stream are separately decoded. The decoding of the turbo stream may be performed using a turbo decoder having a structure as shown in FIG. 15. If the normal stream and the turbo stream are completely decoded, the turbo stream is re-inserted into the dual transmission stream to reconstitute the dual transmission stream in operation S740.

In operation S750, the reconstituted dual transmission stream is deinterleaved. In operation S760, the deinterleaved dual transmission stream is RS decoded. In operation S770, the RS decoded dual transmission stream is derandomized. In operation S780, the dual transmission stream is demultiplexed to restore turbo stream data and normal stream data.

Figures 20, 21:
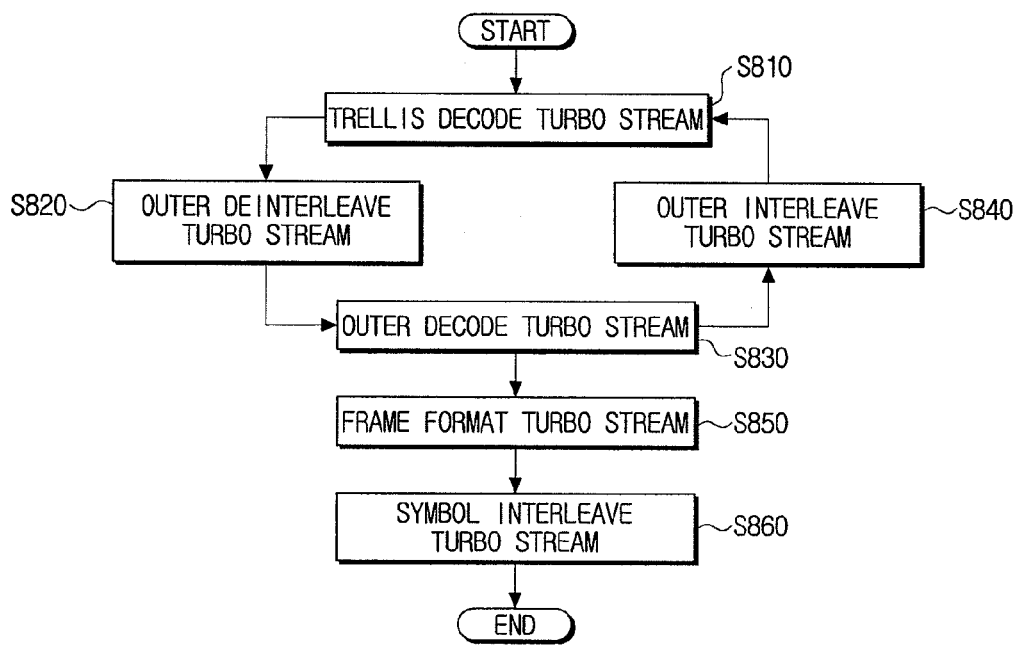
FIG. 20 is a flowchart illustrating a turbo decoding process according to an embodiment of the present invention.
FIG. 21 is a view illustrating a structure of a dual transmission stream processed by a digital broadcasting system according to an embodiment of the present invention.

FIG. 20 is a flowchart illustrating a turbo decoding method according to an embodiment of the present invention. Referring to FIG. 20, in operation S810, a turbo stream of a dual transmission stream is trellis decoded. In operation S820, the trellis decoded turbo stream is outer deinterleaved. In operation S830, the outer deinterleaved turbo stream is outer decoded.

If a hard decision output value is output through outer decoding, the hard decision turbo stream is formatted to a frame of the dual transmission stream in operation S850. In operation S860, the turbo stream is symbol interleaved.

If a soft decision output value is output through the outer decoding, operation S840 is performed to outer interleave the trellis decoded turbo stream. Operations S810 and 820 are performed again to trellis decode and outer deinterleave the outer interleaved turbo stream. Thus, a reliable hard decision turbo stream can be obtained.

FIG. 21 is a view illustrating a structure of a dual transmission stream processed by a digital broadcasting system of an embodiment of the present invention. Referring to FIG. 21, in one field of the dual transmission stream, 78 turbo stream packets are inserted into 312 segment packets. In the dual transmission stream, a packet (188 bytes) of turbo streams and three packets (188 bytes) of normal streams are repeated in a ratio of 1:3. If 70 packets of turbo streams are inserted into 312 segments of the dual transmission stream, a packet of turbo streams and three packets of normal streams are repeated 70 times in a ratio of 1:3, and the remaining 32 packets are constituted as normal stream packets in the dual transmission stream. An SRS having an S byte size is inserted into each packet, and thus a size of the turbo stream is 182-S bytes.

A broadcasting signal corresponding to a turbo stream and a normal stream can be viewed using the above-described broadcasting system and method.

As described above, according to an embodiment of the present invention, a broadcasting service can be performed using a dual transmission stream including a turbo stream and a normal stream. Thus, specific data can be robustly processed and transmitted. As a result, the broadcasting service can be efficiently offered. Also, an SRS can be inserted into the dual transmission stream so that a receiver can easily check a state of a channel. Thus, a compensation degree can be determined. In particular, the above-described operations can be performed using a transmitter and the receiver having simple structures. As a result, reception sensitivity of an ATSC VSB way such as in a United States terrestrial DTV system can be efficiently improved.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A digital broadcasting receiver, comprising:
a demodulator for receiving a transmission stream including a normal data stream and a supplementary data stream and demodulating the received transmission stream;
an equalizer for equalizing the demodulated stream; and
a turbo decoder for decoding the supplementary data stream from the equalized stream,
wherein the transmission stream is processed by a digital broadcasting transmitter so that the stream is converted from a byte unit into a symbol unit, the byte-to-symbol converted stream is encoded and interleaved, the encoded and interleaved stream is re-converted from a symbol unit into a byte unit, and then, the re-converted stream is trellis-encoded by a trellis encoder, and
wherein the trellis encoder initializes an internal memory using two symbols of the stream when a signal pattern which is previously known between the digital broadcasting transmitter and the digital broadcasting receiver is input to the trellis encoder.

2. The digital broadcasting receiver as claimed in claim 1, wherein the turbo decoder comprises a plurality of decoders which decodes the supplementary data stream, respectively, and exchanges information regarding reliability of the decoding with each other, and
wherein the plurality of decoders comprise a trellis decoder and another decoder.

3. The digital broadcasting receiver as claimed in claim 2, wherein the turbo decoder further comprises an interleaver and a de-interleaver disposed between the trellis decoder and the other decoder.

4. The digital broadcasting receiver as claimed in claim 2, wherein the other decoder is a convolution decoder.

5. The digital broadcasting receiver as claimed in claim 4, wherein the turbo decoder further comprises an interleaver and a de-interleaver disposed between the trellis decoder and the convolution decoder.

6. The digital broadcasting receiver as claimed in claim 5, wherein trellis decoder, the de-interleaver, the interleaver and the convolution decoder perform respective operations, in which:
the trellis decoder trellis decodes the supplementary data stream and provides the trellis decoded supplementary stream to the de-interleaver, which de-interleaves the trellis decoded supplementary stream and provides the de-interleaved supplementary data stream to the convolution decoder,
wherein the convolution decoder decodes the de-interleaved supplementary data stream to generate a first value corresponding to a soft decision or a second value corresponding to a hard decision,
wherein if the first value is generated, the convolution decoder provides the first value to the interleaver which interleaves the first value and provides the interleaved first value to the trellis decoder, which trellis decodes the interleaved first value and provides trellis decoded first value to the de-interleaver, which de-interleaves the trellis decoded first value and provides the de-interleaved first value to the convolution decoder,
wherein the convolution decoder decodes the de-interleaved first value to generate another first value corresponding to the soft decision or the second value corresponding to the hard decision, wherein the trellis decoder, the de-interleaver, the convolution decoder and the interleaver repeat the respective operations until the other first value corresponds to the hard decision.

7. The digital broadcasting receiver as claimed in claim 3, wherein trellis decoder, the de-interleaver, the interleaver and the other decoder perform respective operations, in which:

the trellis decoder trellis decodes the supplementary data stream and provides the trellis decoded supplementary stream to the de-interleaver, which de-interleaves the trellis decoded supplementary stream and provides the de-interleaved supplementary data stream to the other decoder, wherein the other decoder decodes the de-interleaved supplementary data stream to generate a first value corresponding to a soft decision or a second value corresponding to a hard decision, wherein if the first value is generated, the other decoder provides the first value to the interleaver which interleaves the first value and provides the interleaved first value to the trellis decoder, which trellis decodes the interleaved first value and provides trellis decoded first value to the de-interleaver, which de-interleaves the trellis decoded first value and provides the de-interleaved first value to the other decoder, wherein the other decoder decodes the de-interleaved first value to generate another first value corresponding to the soft decision or the second value corresponding to the hard decision, wherein the trellis decoder, the de-interleaver, the other decoder and the interleaver repeat the respective operations until the other first value corresponds to the hard decision.

8. A stream processing method of a digital broadcasting receiver, the stream processing method comprising:

receiving a transmission stream including a normal data stream and a supplementary data stream and demodulating the received transmission stream;

equalizing the demodulated stream; and turbo decoding the supplementary data stream by a turbo decoder, wherein the transmission stream is processed by a digital broadcasting transmitter so that the stream is converted from a byte unit into a symbol unit, the byte-to-symbol converted stream is encoded and interleaved, the encoded and interleaved stream is re-converted from a symbol unit into a byte unit, and then, the re-converted stream is trellis-encoded by a trellis encoder, and wherein the trellis encoder initializes an internal memory using two symbols of the stream when a signal pattern which is previously known between the digital broadcasting transmitter and the digital broadcasting receiver is input to the trellis encoder.

9. The stream processing method as claimed in claim 8, wherein the turbo decoder comprises a plurality of decoders which decodes the supplementary data stream, respectively, and exchanges information regarding reliability of the decoding with each other, and wherein the plurality of decoders comprise a trellis decoder and another decoder.

10. The stream processing method as claimed in claim 9, wherein the other decoder is a convolution decoder.

11. The stream processing method as claimed in claim 10, wherein the turbo decoder further comprises an interleaver and a de-interleaver disposed between the trellis decoder and the convolution decoder.

12. The stream processing method as claimed in claim 11, wherein trellis decoder, the de-interleaver, the interleaver and the convolution decoder perform respective operations, in which:

the trellis decoder trellis decodes the supplementary data stream and provides the trellis decoded supplementary stream to the de-interleaver, which de-interleaves the trellis decoded supplementary stream and provides the de-interleaved supplementary data stream to the convolution decoder, wherein the convolution decoder decodes the de-interleaved supplementary data stream to generate a first value corresponding to a soft decision or a second value corresponding to a hard decision, wherein if the first value is generated, the convolution decoder provides the first value to the interleaver which interleaves the first value and provides the interleaved first value to the trellis decoder, which trellis decodes the interleaved first value and provides trellis decoded first value to the de-interleaver, which de-interleaves the trellis decoded first value and provides the de-interleaved first value to the convolution decoder, wherein the convolution decoder decodes the de-interleaved first value to generate another first value corresponding to the soft decision or the second value corresponding to the hard decision, wherein the trellis decoder, the de-interleaver, the convolution decoder and the interleaver repeat the respective operations until the other first value corresponds to the hard decision.

13. The stream processing method as claimed in claim 9, wherein the turbo decoder further comprises an interleaver and a de-interleaver disposed between the trellis decoder and the other decoder.

14. The stream processing method as claimed in claim 13, wherein trellis decoder, the de-interleaver, the interleaver and the other decoder perform respective operations, in which:

the trellis decoder trellis decodes the supplementary data stream and provides the trellis decoded supplementary stream to the de-interleaver, which de-interleaves the trellis decoded supplementary stream and provides the de-interleaved supplementary data stream to the other decoder, wherein the other decoder decodes the de-interleaved supplementary data stream to generate a first value corresponding to a soft decision or a second value corresponding to a hard decision, wherein if the first value is generated, the other decoder provides the first value to the interleaver which interleaves the first value and provides the interleaved first value to the trellis decoder, which trellis decodes the interleaved first value and provides trellis decoded first value to the de-interleaver, which de-interleaves the trellis decoded first value and provides the de-interleaved first value to the other decoder, wherein the other decoder decodes the de-interleaved first value to generate another first value corresponding to the soft decision or the second value corresponding to the hard decision, wherein the trellis decoder, the de-interleaver, the other decoder and the interleaver repeat the respective operations until the other first value corresponds to the hard decision.

* * * * *